(12) United States Patent
Lee et al.

(10) Patent No.: US 6,642,336 B1
(45) Date of Patent: Nov. 4, 2003

(54) PHOTOSENSITIVE POLYMER

(75) Inventors: Sook Lee, Seoul (KR); Ki-young Kwon, Seoul (KR); Si-hyeung Lee, Suwon (KR); Kwang-sub Yoon, Seoul (KR); Hyun-woo Kim, Seonganm (KR); Dong-won Jung, Yongin (KR); Sang-jun Choi, Seoul (KR); Sang-gyun Woo, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 192 days.

(21) Appl. No.: 09/644,101

(22) Filed: Aug. 23, 2000

(30) Foreign Application Priority Data

Aug. 24, 1999 (KR) ......................................... 1999-35193
Apr. 10, 2000 (KR) ......................................... 2000-18673

(51) Int. Cl.$^7$ ................................................. C08F 10/00
(52) U.S. Cl. ....................... 526/282; 526/272; 526/281; 526/317.1; 526/320; 430/270.1
(58) Field of Search ................................ 526/272, 281, 526/282, 317.1, 320; 430/270.1

(56) References Cited

U.S. PATENT DOCUMENTS 6,316,162 B1 * 11/2001 Jung et al. .................. 430/291
6,391,518 B1 * 5/2002 Jung et al. ................ 430/270.1

FOREIGN PATENT DOCUMENTS

EP 1 031 879 A 8/2000

OTHER PUBLICATIONS

Y.Eutani et al., "Standard developer available ArF resist and performance" Proceedings of the Spie—The International Society for Optical engineering, vol. 3333, No. 1, Feb. 25, 1998, pp. 546–533, XP002179487 USA.

Jim–Baek Kim et al., "Chemically amplified resist based on the norbornene copolymers with steroid derivatives" Proceedings of the Spie—The International Society for Optical Engineering, vol. 3578, No. 1, Mar. 17, 1999, pp. 36–43, XP002179488 USA.

M. Rahman et al, "Cycloolefin/maleic anhydride copolymers for 193 nm resist compositions", Proceedings of the Spie—The International Society for Optical Engineering, vol. 3678, No. 2, Mar. 17, 1999, pp. 1193–1200, XP002179489 USA.

D. Pasini et al., "Carbon–rich cyclopolymers: their synthesis, etch resistance, and application to 193 nm microlithography" Proceedings of the Spie—The International Society for Optical Engineering, vol. 3678, No. 1, Mar. 17, 1999, pp. 94–101, XP00219486 USA.

Dario Pasini et al., "Carbon–Rich Cyclopolymers: Their Synthesis, Etch Resistance, and Application to 193 nm Microlithogrphy", SPIE Conference on Advances in Resist Technology and Processing XVI, March 1999, SPIE vol. 3678, pp. 94–101.

* cited by examiner

Primary Examiner—Helen L. Pezzuto
(74) Attorney, Agent, or Firm—Volentine Francos, PLLC

(57) ABSTRACT

A photosensitive polymer which maintains transparency even when exposed to a short-wavelength light source of 193 nm or below, exhibits improved adhesiveness to a substrate, improved contrast and improved resistance to dry etching. The photosensitive polymer includes a first monomer which is alicyclic hydrocarbon carboxylate having an acid-labile $C_6$ to $C_{20}$ tertiary alicyclic hydrocarbon group as a substituent, and a second monomer which is capable of free radical polymerization.

21 Claims, No Drawings

PHOTOSENSITIVE POLYMER

BACKGROUND OF THE INVENTION

1. Field of the Invention

The present invention relates to a photosensitive polymer.

2. Description of the Related Art

As semiconductor devices become highly integrated, photolithography processes used in the manufacture of such devices must be capable of fine pattern formation. Further, as a result of sub-quarter micron or smaller sized patterns which are needed in semiconductor memory devices having capacities exceeding 1 Gbit, a photolithography technique has been proposed in which an argon fluoride (ArF) excimer laser (wavelength: 193 nm) is used as a new type of exposure light source. The use of the ArF excimer laser stems from the fact that its wavelength is less than that of the more conventional krypton fluoride (KrF) excimer laser (wavelength: 248 nm). As a result, there is an increasing demand for new chemically amplified photoresist polymers and photoresist compositions which are suitable for use with the ArF excimer laser.

In general, a chemically amplified photoresist composition for an ArF excimer laser should preferably exhibit the following characteristics: (1) transparency at a wavelength of 193 nm; (2) excellent thermal properties (for example, high glass transition temperature); (3) good adhesion to underlying and overlying film materials; (4) high resistance to dry etching; and (5) easily capable of being developed using developing solutions which are in widespread use in the manufacture of semiconductor devices, for example, 2.38% by weight of tetramethyl ammonium hydroxide (TMAH).

However, a terpolymer comprising methylmethacrylate, t-butyl methacrylate and methacrylic acid, which is a widely known chemically amplified photoresist polymer for the ArF excimer laser, does not exhibit all of the above-described characteristics. In particular, the terpolymer has a very low resistance to dry etching and a low adhesion to underlying and overlying film materials.

Recently, attempts have been made to prepare photosensitive polymers for the ArF excimer laser having increased etching resistances using (meth)acrylate which has alicyclic compounds, for example, isobornyl, adamantyl or tricyclodecanyl group, as a substitutent or t-butyl norbornene carboxylate. However, these polymers also have several disadvantages. For example, their etching resistance and adhesion characteristics to film materials are still poor, which results in lifting of photoresist patterns.

SUMMARY OF THE INVENTION

It is an objective of the present invention to provide a photosensitive polymer which maintains transparency even when exposed to a short-wavelength light source of 193 nm or below, and which has improved adhesive, contrast, and resistance to dry etching characteristics.

It is another objective of the present invention to provide a chemically amplified photoresist composition containing the photosensitive polymer.

Accordingly, to achieve the above objective, there is provided a photosensitive polymer including a first monomer which is an alicyclic hydrocarbon carboxylate having an acid-labile $C_8$ to $C_{20}$ tertiary alicyclic hydrocarbon group as a substituent, and a second monomer which is capable of free radical polymerization.

Preferably, the alicyclic hydrocarbon carboxylate is norbornene carboxylate, the second monomer is maleic anhydride, and the $C_8$ to $C_{20}$ tertiary alicyclic hydrocarbon group is 2-methyl-2-norbornyl, 2-methyl-2-isobornyl, 8-ethyl-8-tricyclo[$5.2.1.0^{2,6}$]decanyl, 2-methyl-2-adamantyl, 2-ethyl-2-adamantyl or 1-adamantyl-1-methyl ethyl.

The photosensitive polymer according to present invention is polymerized with one or more monomers selected from the group consisting of a third monomer, a fourth monomer and a fifth monomer, in addition to the first and second monomers, wherein the third monomer is a monomer having a secondary cyclic alcohol group bonded to its backbone; wherein the fourth monomer is a monomer selected from the group consisting of (meth)acrylic acid, (meth)acrylate having $C_1$ to $C_{12}$ aliphatic alcohol as a substituent, (meth)acrylate having an acid-labile group as a substituent, and (meth)acrylate having a dissolution inhibitor group as a substituent; and wherein the fifth monomer is a monomer selected from the group consisting of norbornene, norbornene-ol, norbornene having $C_1$ to $C_{12}$ aliphatic alcohol as a substituent, norbornene carboxylic acid, norbornene dicarboxylic anhydride, norbornene carboxylate having $C_1$ to $C_{12}$ aliphatic alcohol as a substituent, norbornene carboxylate having a lactone group as a substituent, norbornene carboxylate having an acid-labile group as a substituent, and norbornene carboxylate having a dissolution inhibitor group as a substituent.

Preferably, the third monomer is secondary polycyclic alcohol.

The photosensitive polymer according to the preferred embodiment of the present invention has a cyclic backbone, and an acid-labile $C_8$ to $C_{20}$ tertiary alicyclic hydrocarbon group is bonded to the backbone. Thus, a photoresist composition containing the same exhibits a high resistance to etching. Also, since there is a large difference in the solubility before and after exposure, the contrast is excellent.

DESCRIPTION OF THE PREFERRED EMBODIMENTS

A photosensitive polymer and a chemically amplified photoresist composition containing the same according to the present invention will now be described. Also, a preferred photolithography process using the chemically amplified photoresist composition will be described. This invention may, however, be embodied in many different forms, and these embodiments are provided so that this disclosure will be thorough and complete, and will fully convey the scope of the invention to those skilled in the art.

Photosensitive Polymer

A photosensitive polymer according to the present invention includes a first monomer which is an alicyclic hydrocarbon carboxylate having an acid-labile $C_8$–$C_{20}$ tertiary alicyclic hydrocarbon group as a substituent and a second monomer capable of free radical polymerization. The weight average molecular weight of the photosensitive polymer is preferably in the range of 1,000 to 100,000.

Suitable alicyclic hydrocarbons constituting a backbone of the first monomer include norbornene, isobornene, adamantene and the like.

2-methyl-2-norbornyl, 2-methyl-2-isobornyl, 8-ethyl-8-tricyclo[$5.2.1.0^{2,6}$]decanyl, 2-methyl-2-adamantyl, 2-ethyl-2-adamantyl or 1-adamantyl-1-methylethyl is preferably used as the $C_8$–$C_{20}$ tertiary alicyclic hydrocarbon group, which can be expressed by the formula below. Since the alicyclic hydrocarbon group is a tertiary alkyl group, it is acidolyzed.

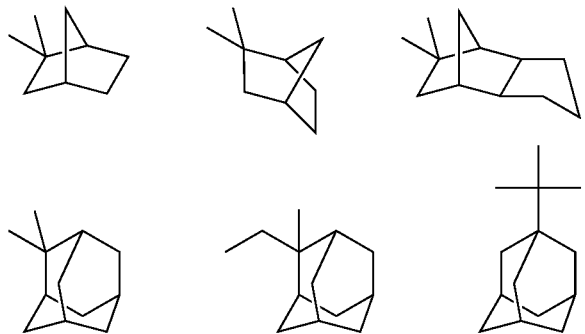

Suitable second monomers capable of free radical polymerization to introduce a first monomer into the photosensitive polymer include maleic anhydride.

The photosensitive polymer according to the present invention has a cyclic backbone like in an alicyclic hydrocarbon or maleic anhydride. Also, since a $C_6$–$C_{20}$ tertiary alicyclic hydrocarbon group is bonded to the backbone of the polymer, the etching resistance of the photosensitive polymer is much larger than that of the conventional photosensitive polymer.

The etching resistance of a polymer is generally known to be inversely proportion to an Ohnishi parameter, which is calculated by the following formula (1):

Ohnishi parameter=$N_T/N_c-N_o$ wherein $N_T$ is the total number of atoms in the polymer, $N_c$ is the number of carbon atoms in the polymer and $N_o$ is the number of oxygen atoms in the polymer.

Table 1 lists Ohnishi parameters calculated by the formula (1) in the prior art polymer and in the polymer of the present invention.

TABLE 1

| Classification | | Ohnishi parameter |
|---|---|---|
| Prior art polymer | Poly(methyladamantylacrylate-cyclopentanoate acrylate) | 3.59 |
| | Poly(t-butylnorbornenecarboxylate-maleic anhydride) | 3.73 |
| Present invention polymer | Poly(2-methyl-2-norbornyl norbornene carboxylate-maleic anhydride) | 3.32 |
| | Poly(2-methyl-2-isobornyl norbornene carboxylate-maleic anhydride) | 3.29 |
| | Poly(8-ethyl-8-tricyclo[5.2.1.0$^{2,6}$]-decanyl norbornene carboxylate-maleic anhydride) | 3.18 |
| | Poly(2-methyl-2-adamantyl norbornene carboxylate-maleic anhydride) | 3.18 |
| | Poly(1-adamantyl-1-methyl ethyl norbornene carboxylate-maleic anhydride) | 3.17 |

It is generally known that dry etching resistance is good when the Ohnishi parameter is less than or equal to 3.4, preferably less than or equal to 3.2. From Table 1, it is predictable that the dry etching resistance of the polymer according to the present invention is substantially improved when compared to that of the conventional polymer.

It is preferred that the photosensitive polymer according to the present invention further includes another monomer capable of enhancing characteristics required for the photosensitive polymer.

That is, it is advantageous that the photosensitive polymer according to the present invention is a terpolymer having a third monomer combined with the first and second monomers.

The third monomer is preferably a molecule having a secondary cyclic alcohol group. The third monomer having a secondary cyclic alcohol group increases the etching resistance of the polymer and noticeably increases the adhesion to underlying film materials. In particular, a secondary alcohol group, which is chemically stable, is advantageous, since it can be maintained for a long time.

As the third monomer, secondary polycyclic alcohol is more preferably used. For example, secondary $C_{10}$ to $C_{15}$ tricyclo alcohol is suitably used as the third monomer.

Another terpolymer according to the present invention is a terpolymer having a fourth monomer combined with the first and second monomers.

The fourth monomer is preferably a monomer selected from the group consisting of (meth)acrylic acid, (meth) acrylate having $C_1$ to $C_{12}$ aliphatic alcohol as a substituent, (meth)acrylate having an acid-labile group as a substituent, and (meth)acrylate having a dissolution inhibitor group as a substituent.

The fourth monomer is selected according to the properties necessary for use in a photosensitive polymer.

In order to enhance the adhesion of the polymer, (meth) acrylic acid or (meth)acrylate having $C_1$ to $C_{12}$ aliphatic alcohol as a substituent is used.

In the case where it is a critical issue to enhance contrast, (meth)acrylate having an acid-labile group as a substituent is used. The acid-labile group refers to a group which allows the polymer to exhibit non-dissolution in a developing solution when it is bonded to the polymer but to exhibit dissolution when it is acidolyzed.

In the case where a large number of hydrophilic functional groups are present in another monomer constituting the polymer, so that an unexposed region may also be developed with a conventional developing solution, (meth)acrylate having a dissolution inhibitor group as a substituent is preferably used as the monomer. The dissolution inhibitor group refers to a group which is a hydrophobic group that is not acidolyzed by an acid generated by exposure.

When it is necessary to enhance the wettability against the developing solution, (meth)acrylate is preferably used.

Preferably, the $C_1$ to $C_{12}$ aliphatic alcohol pendent to (meth)acrylate is 2-hydroxyethyl, the acid-labile group pendent to (meth)acrylate is t-butyl or $C_6$ to $C_{20}$ tertiary alicyclic hydrocarbon, and the dissolution inhibitor group pendent to (meth)acrylate is methyl or $C_7$ to $C_{20}$ aliphatic hydrocarbon. Examples of the $C_7$ to $C_{20}$ tertiary alicyclic hydrocarbon include adamantyl, norbornyl or isobornyl.

Still another terpolymer according to the present invention is a terpolymer having a fifth monomer combined with the first and second monomers.

The fifth monomer is preferably a monomer selected from the group consisting of norbornene, norbornene-ol, norbornene having $C_1$ to $C_{12}$ aliphatic alcohol as a substituent, norbornene carboxylic acid, norbornene dicarboxylic anhydride, norbornene carboxylate having $C_1$ to $C_{12}$ aliphatic alcohol as a substituent, norbornene carboxylate having a lactone group as a substituent, norbornene carboxylate having an acid-labile group as a substituent, and norbornene carboxylate having a dissolution inhibitor group as a substituent.

In terms of the kind of monomers selected, the fifth monomer is also selected according to the properties necessary for use in a photosensitive polymer.

In the case where it is necessary to enhance adhesion of a polymer or to reduce swelling of a photoresist pattern having the polymer as a main component, norbornene-ol, norbornene having $C_1$ to $C_{12}$ aliphatic alcohol as a substituent, norbornene carboxylate having $C_1$ to $C_{12}$ aliphatic alcohol as a substituent, norbornene dicarboxylic anhydride or norbornene carboxylate having a lactone group as a substituent, is preferably used.

In particular, in the case where norbornene dicarboxylic anhydride or norbornene carboxylate having a lactone group as a substituent is used as the monomer, the adhesion is improved, and a photoresist pattern formed using the same has an excellent profile without roughness.

In the case where it is a critical issue to enhance contrast, norbornene carboxylate having an acid-labile group as a substituent is used.

In the case where a large number of hydrophilic functional groups are present in another monomer constituting the polymer so that an unexposed region may also be developed with a conventional developing solution, norbornene carboxylate having a dissolution inhibitor group as a substituent is preferably used as the monomer.

When it is necessary to enhance the wettability against the developing solution, norbornene carboxylic acid-is preferably used.

Preferably, the $C_1$ to $C_{12}$ aliphatic alcohol pendent to norbornene is 2-hydroxymethyl, the $C_1$ to $C_{12}$ aliphatic alcohol pendent to norbornene carboxylate is 2-hydroxyethyl, the lactone group pendent to norbornene carboxylate is 2,4 dihydroxy-3,3-dimethyl butyric acid lactone or 2(3),4 dihydroxy butyric acid lactone, the acid-labile group pendent to norbornene carboxylate is t-butyl, tetrahydropyranyl or 1-alkoxyethyl, and the dissolution inhibitor group pendent to norbornene carboxylate is methyl.

As occasion demands, the photosensitive polymer according to the present invention may be a tetrapolymer having a fourth or fifth polymer polymerized with the first, second and third monomers. As described above, the monomer ratio can be adjusted according to properties required for use in the photosensitive polymer. A tetrapolymer having the first, second, fourth and fifth monomers polymerized therein can also be used as the photosensitive polymer according to the present invention.

The photosensitive polymer according to the present invention can be represented by the formula (1):

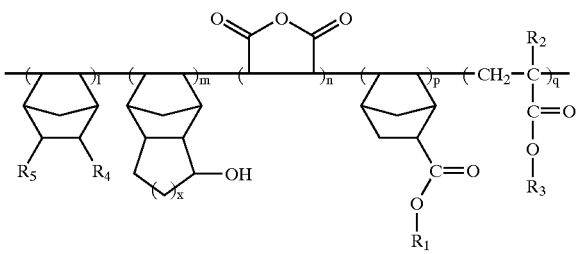

wherein $R_1$ is an acid-labile $C_8$ to $C_{20}$ tertiary alicyclic hydrocarbon group;

$R_2$ is hydrogen or methyl;

$R_3$ is hydrogen, $C_1$ to $C_{12}$ aliphatic alcohol, an acid-labile group or a dissolution inhibitor group;

$R_4$ is hydrogen, hydroxy, $C_1$ to $C_{12}$ aliphatic alcohol, carboxy, oxycarbonyl having $C_1$ to $C_{12}$ aliphatic alcohol pendant group, oxycarbonyl having a lactone pendant group, oxycarbonyl having an acid-labile pendant group, oxycarbonyl having a dissolution inhibitor pendant group or carboxylic anhydride linked to $R_5$;

$R_5$ is hydrogen, hydroxy, $C_1$ to $C_{12}$ aliphatic alcohol, carboxy, oxycarbonyl having $C_1$ to $C_{12}$ aliphatic alcohol pendant group, oxycarbonyl having a lactone pendant group, oxycarbonyl having an acid-labile pendant group, oxycarbonyl having a dissolution inhibitor pendant group or carboxylic anhydride linked to $R_4$;

x is an integer in the range of 1 to 5;

l, m, n, p and q are integers; and $l/(l+m+n+p+q)$ equals 0.0 to 0.3, $m/(l+m+n+p+q)$ equals 0.0 to 0.3, $n/(l+m+n+p+q)$ equals 0.1 to 0.6, $p/(l+m+n+p+q)$ equals 0.1 to 0.6, and $q/(l+m+n+p+q)$ equals 0.0 to 0.5.

The weight average molecular weight of the polymer is preferably in the range of 1,000 to 100,000.

Most preferably, examples of $R_1$ include 2-methyl-2-norbornyl, 2-methyl-2-isobornyl, 8-ethyl-8-tricyclo[5.2.1.0$^{2,6}$]decanyl, 2-methyl-2-adamantyl, 2-ethyl-2-adamantyl or 1-adamantyl-1-methylethyl. In $R_3$, the $C_1$ to $C_{12}$ aliphatic alcohol is 2-hydroxyethyl, the acid-labile group is t-butyl or $C_8$ to $C_{20}$ tertiary alicyclic hydrocarbon, and the dissolution inhibitor group is methyl or $C_7$ to $C_{20}$ aliphatic hydrocarbon. Examples of the $C_7$ to $C_{20}$ aliphatic hydrocarbon include isobornyl, norbornyl or adamantyl.

In either $R_4$ or $R_5$, it is preferred that the $C_1$ to $C_{12}$ aliphatic alcohol is hydroxymethyl, the oxycarbonyl having $C_1$ to $C_{12}$ aliphatic alcohol pendant group is 2-hydroxyethyloxycarbonyl, oxycarbonyl having a lactone pendant group is 2,4 dihydroxy-3,3-dimethyl butyric acid lactonyl oxycarbonyl or 2(3),4 dihydroxy butyric acid lactonyl oxycarbonyl, oxycarbonyl having an acid-labile pendant group is t-butyloxycarbonyl, tetrahydropyranyloxycarbonyl or 1-alkoxyethyloxycarbonyl, and the oxycarbonyl having a dissolution pendant inhibitor group is methyloxycarbonyl.

Since the backbone of the photosensitive polymer according to the present invention has a cyclic structure, the etching resistance thereof is large. In particular, since the $C_8$ to $C_{20}$ tertiary hydrocarbon group is bonded to the backbone, the etching resistance is further increased. Also, when a secondary cyclic alcohol group is bonded to the backbone, the polymer also exhibits good adhesion to underlying layers and high wettability to a developing solution, and the etching resistance is further increased.

Chemically Amplified Photoresist Composition

A chemically amplified photoresist composition of the present invention includes the above-described photosensitive polymer and a photoacid generator. The photoacid generator is preferably contained in an amount of 1 to 15% by weight based on the total weight of the photosensitive polymer. The photoacid generator is preferably a substance that has a high thermal stability. Therefore, suitable photoacid generators include triarylsulfonium salts, diaryliodonium salts, sulfonates or N-hydroxysuccinimide triflates.

Examples of photoacid generators include triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitro benzyl sulfonate, pyrogallol tris(alkylsulfonates), pyrogalloltris(alkylsulfonates)), norbornenedicarboximide triflate, triphenylsulfonium nonaflate, diphenyliodonium nonaflate, methoxydiphenyliodonium nonaflate, di-t-butyldiphenyliodonium nonaflate, N-hydroxysuccinimide nonaflates, norbornene dicarboximide nonaflate, triphenylsulfonium perfluorooctanesulfonates, diphenyliodonium perfluorooctanesulfonates, methoxydiphenyliodonium perfluorooctane sulfonates, di-t- butyldiphenyliodonium triflate, N-hydroxysuccinimide perfluorooctanesulfonates, or norbornene dicarboximide perfluorooctanesulfonates.

Preferably, the photoresist composition of the present invention further includes 0.01 to 10% by weight of organic base based on the total weight of the photosensitive polymer. Suitable organic bases include triethylamine, triisobutylamine, triisooctylamine, diethanolamine, triethanolamine or a mixture thereof. The organic base is added for preventing a pattern deformation, which results from an unexpected acidolysis caused by the acid generated at the exposed regions and then diffused into the unexposed regions.

Also, the chemically amplified photoresist composition according to the present invention includes 30 to 200 ppm of an organic or base surfactant, which functions to allow the photoresist composition to be uniformly coated on a substrate.

Method for Preparing Photosensitive Polymer
Synthesis of Monomer

Cyclopentadiene is dissolved in an organic solvent and then acrylate having a $C_8$ to $C_{20}$ tertiary alicyclic hydrocarbon group as a substituent is added thereto to prepare a first monomer (I) as expressed by the following reaction scheme (1):

[Reaction scheme 1]

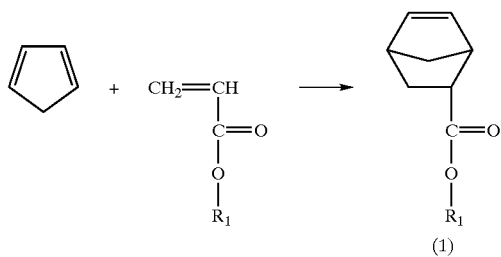

wherein $R_1$ is a $C_8$ to $C_{20}$ tertiary alicyclic hydrocarbon group.

Preferably, $R_1$ is 2-methyl-2-norbornyl, 2-methyl-2-isobornyl, 8-ethyl-8-tricyclo[5.2.1.0$^{2,6}$]decanyl, 2-methyl-2-adamantyl, 2-ethyl-2-adamantyl or 1-adamantyl-1-methylethyl.

Synthesis of Polymer

The monomer (I) prepared in the above-described manner, a second monomer (II), a third monomer (III), a fourth monomer (IV) and a fifth monomer (V) are dissolved in an organic solvent, for example, toluene, in a mixture ratio of p:n:m:q:l, and then a polymerization initiator, e.g., azobisisobutyronitrile (AIBN) is added thereto to carry out polymerization to prepare a polymer, as expressed by the following reaction scheme (2), and the polymerization ratio is the same as defined in the above formula (1):

[Reaction scheme 2]

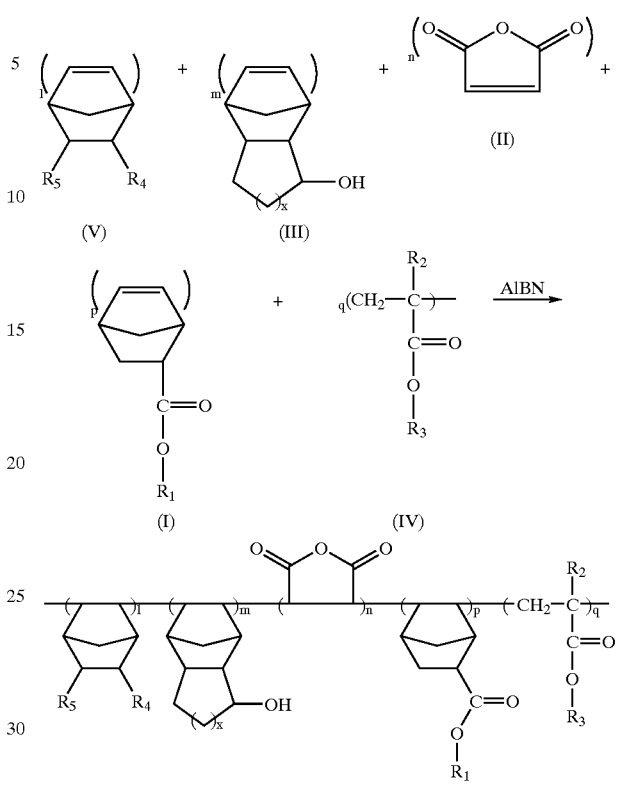

Method of Preparing Chemically Amplified Photoresist Composition and Photolithography Process Using the Same The chemically amplified photoresist composition according to the present invention is prepared by dissolving the photosensitive polymer prepared in the above-described manner and a photoacid generator, in an appropriate solvent, and mixing the same. Here, the photoacid generator is mixed in an amount of 1 to 15% by weight based on the weight of the polymer. Also, it is preferable to complete the photoresist composition by further dissolving 0.01 to 10% by weight of an organic base based on the weight of the polymer. Also, 30 to 200 ppm of a surfactant is preferably further included in the composition.

The chemically amplified photoresist composition prepared in the above-described manner can be used for a general photolithography process, and is particularly suitable for forming a fine pattern to satisfy a design rule of 0.25 $\mu$m or smaller using an ArF excimer laser as an exposure light source.

First, the photoresist composition is coated on a substrate where a patterning object material is formed, to form a photoresist layer having a predetermined thickness, preferably 0.2 to 2 $\mu$m. Subsequently, pre-baking is carried out on the photoresist layer. The pre-baking step is performed at a temperature of 70 to 160° C. for 30 to 360 seconds. After the pre-baking step, the photoresist layer is exposed using a mask having a predetermined pattern, using an exposure light source having a wavelength of 248 nm or less, preferably an ArF excimer laser having a wavelength of 193 nm. Acid is generated in the photoacid generator contained in the photoresist layer by exposure. The photosensitive polymer is acidolyzed by the catalytic action of the thus-generated acid, as expressed by reaction scheme 3. As a result, a large amount of hydrophilic groups, e.g., carboxy groups, are produced in the exposed portion of the photoresist layer. Thus, a noticeable difference in the polarity of the photoresist layer is created between an exposed region and an unexposed region. That is to say, contrast is noticeably increased.

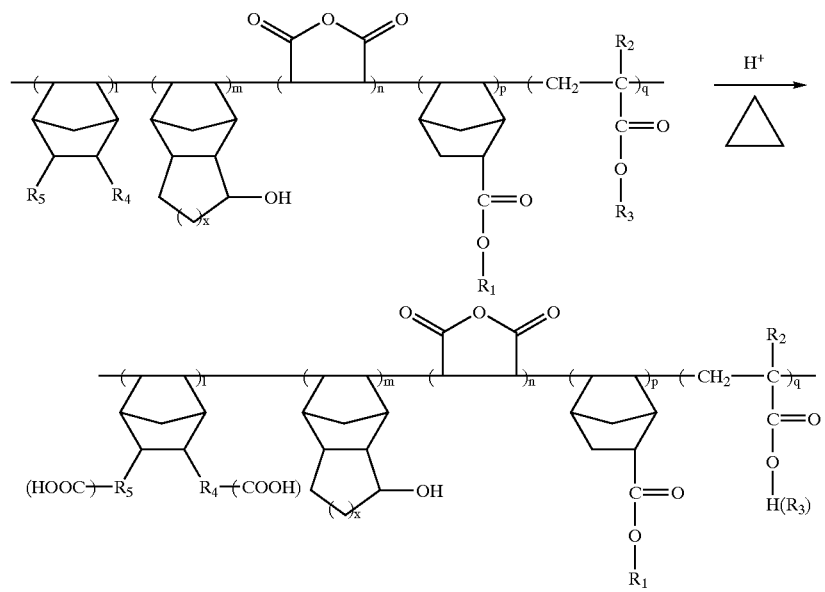

[Reaction scheme 3]

The parenthesis enclosing $R_3$ represent that $R_3$ is not acidolyzed but is retained since it is a dissolution inhibitor group or $C_1$ to $C_{12}$ aliphatic alcohol. The parenthesis enclosing —COOH next to $R_4$ represent a carboxy group remaining after $R_4$ is acidolyzed in the case where $R_4$ is a carboxyl group or an oxycarbonyl group having a acid-labile group as a substituent.

After exposure, the photoresist layer is thermally treated for a short time before development, which is referred to as a post-exposure-thermal treatment. The post-exposure-thermal treatment is performed for the purpose of increasing contrast by further activating acidolysis of exposed regions by the acidic catalyst, to acidolyze ester or acidic anhydride contained in the photosensitive polymer into carboxy groups.

Next, development is performed using an appropriate developing solution to complete a photoresist pattern. Here, the developing solution used is a developing solution for general development processes, for example, 2.38% by weight of tetramethylammonium hydroxide (TMAH). In the case where a dissolution inhibitor group is bonded to the backbone of the photosensitive polymer constituting the photoresist layer, since the photoresist layer in the unexposed region is not easily dissolved in the developing solution, the thickness of the photoresist layer in the unexposed region is not reduced, unlike the conventional art.

After forming the photoresist pattern, a patterning object layer is etched to form a desired pattern. The photoresist pattern of the present invention is formed of a photoresist layer including a photosensitive polymer having a cyclic backbone and a $C_8$ to $C_{20}$ tertiary alicyclic hydrocarbon pendent to the backbone, and thus the etching resistance thereof is large. Therefore, a pattern having a good profile, that is, having a precise critical dimension, can be formed.

The present invention will now be described in more detail with reference to the following examples and should not be construed as limited thereto.

Synthesis of Monomer

EXAMPLE 1

Synthesis of 1-Adamanty-1-methylethyl-5-norbornene-2-carboxylate 300 mL of THF was put in a round-bottom flask and then cooled to −24° C. using an ice-salt bath, and then 66.10 g (1 mol) of cyclopentadiene derived from dicyclopentadiene by simple distillation, was added thereto. Next, 248.36 g (1 mol) of 1-adamantyl-1-methylethyl acrylate was slowly added to be reacted at −24° C. for about 4 hours. Then, the temperature of the reactant was slowly raised to room temperature to be reacted for about 24 hours and then a reactant product was separated using vacuum distillation (yield: 85%).

EXAMPLE 2

Synthesis of 2-Methyl-2-norbornyl-5-norbornene-2-carboxylate

The reactant product was obtained in the same manner as in Example 1, except that 236.35 g (1 mol) of 2-methyl-2-norbornyl acrylate was used, instead of 1-adamantyl-1-methylethyl acrylate (yield: 88%).

EXAMPLE 3

Synthesis of 8-Ethyl-8-tricyclo[5.2.1.0$^{2,6}$]decanyl-5-norbornene-2-carboxylate The reactant product was obtained in the same manner as in Example 1, except that 234.33 g (1 mol) of 8-ethyl-8- tricyclo[5.2.1.0$^{2,6}$]decanyl acrylate was used, instead of 1-adamantyl-1-methylethyl acrylate (yield: 86%).

EXAMPLE 4

Synthesis of 2,4 Dihydroxy-3,3-dimethylbutyric Acid Lactonyl-5-norbornene-2-carboxylate 130.14 g (1 mol) of 2,4 dihydroxy-3,3-dimethylbutyric lactone was put in a round-bottom flask and dissolved in dry methylene chloride, and triethylamine was added to the resultant mixture. Thereafter, 90.50 g of acryloyl chloride was slowly dropped to the reaction mixture using a dropping funnel. The completion of reaction was identified using thin-film chromatography and then produced salts were filtered using a filter. Subsequently, methylene chloride used as a solvent was removed and the remaining reactants were extracted using ether. The ether was removed under a low pressure and then an initial product was dissolved in THF, and then 66 g of cyclopentadiene was added thereto to then be reacted for about 24 hours. It was identified using thin-film chromatography that acrylate was completely removed, and then the reaction was completed. The THF solvent was removed using a rotary evaporator, and then the reactant product was separated using vacuum distillation (yield: 95%).

EXAMPLE 5

Synthesis of 2(3),4 Dihydroxylbutyric Acid-lactonyl-5-norbornene-2-carboxylate The reaction was carried out in the same manner as in Example 4, except that 120.09 g (1 mol) of 2(3),4 dihydroxy-butylic lactone was used instead of 130.14 g (1 mol) of 2,4 dihydroxy-3,3-dimethylbutyric acid lactone, to separate the reactant product (yield: 97%).

Synthesis of Polymer

EXAMPLE 6

Poly(1-adamantyl-1-methylethyl-5-norbornene-2-carboxylate-maleic Anhydride)

10.8 g of 1-adamantyl-1-methylethyl-5-norbornene-2-carboxylate prepared in Example 1, and 3.37 g of maleic anhydride were dissolved in 7.1 9 of THF. 0.112 g of AIBN was added to the resultant, degassed and polymerized at a temperature of about 65° C. for about 24 hours.

After the polymerization was complete, the reactant material was precipitated in an excess mixed solution about 10 times of hexane and isopropylalcohol in a ratio of 8:1, and the precipitate was dissolved again in THF. Then, the resultant was reprecipitated in a mixed solution of n-hexane and diethyl ether in a ratio of 3:1 two times. The precipitate was filtered using a glass filter and then dried in a vacuum oven maintained at about 50° C. for about 24 hours to separate the polymer (yield: 32%).

The weight average molecular weight and polydispersity of the obtained polymer were 4,400 and 1.5, respectively.

EXAMPLE 7

Poly(2-methyl-2-norbornyl-5-norbornene-2-carboxylate-maleic Anhydride)

12.32 g of 2-methyl-2-norbornyl-5-norbornene-2-carboxylate prepared in Example 2 and 4.9 g of maleic anhydride were completely dissolved in 9.68 g of anhydrous ethyl acetate. 0.15 g of AIBN was added to the resultant, purged using nitrogen gas for about 2 hours and polymerized at a temperature of about 65° C. for about 24 hours.

After the polymerization was complete, the reactant material was precipitated in an excess mixed solution about 10 times of n-hexane and isopropylalcohol in a ratio of 8:1, and the precipitate was dissolved again in THF. Then, the resultant was reprecipitated in an excess mixed solution about 10 times of n-hexane and isopropyl alcohol in a ratio of 8:1 two times. The precipitate was filtered using a glass filter and then dried in a vacuum oven maintained at about 50° C. for about 24 hours to separate 4.2 g of polymer.

The weight average molecular weight and polydispersity of the obtained polymer were 10,100 and 1.74, respectively.

EXAMPLE 8

Poly(8-ethyl-8-tricyclo[5.2.1.0$^{2,6}$]decanyl-5-norbornene-2-carboxylate-maleic Anhydride)

Polymerization and separation were carried out in the same manner as in Example 7 to separate 4.8 g of a polymer, except that 14.31 g of 8-ethyl-8-tricyclo[5.2.1.0$^{2,6}$]decanyl-5-norbornene-2-carboxylate prepared in Example 3 was used, instead of 2-methyl-2-norbornyl-5-norbornene-2-carboxylate.

The weight average molecular weight and polydispersity of the obtained polymer were 11,000 and 1.65, respectively.

EXAMPLE 9

Poly(1-adamantyl-1-methylethyl-5-norbornene-2-carboxylate-maleic Anhydride-3-hydroxytricyclo [6.2.1.0$^{2,7}$]-9-undecene)

5.3 g of 1-adamantyl-1-methylethyl-5-norbornene-2-carboxylate, 2.47 g of maleic anhydride and 1.38 g of 3-hydroxytricyclo[6.2.1.0$^{2,7}$]-9-undecene were dissolved in 4.6 g of ethylacetate. 0.084 g of AIBN was added to the resultant, degassed and polymerized at a temperature of about 65° C. for about 24 hours.

Thereafter, the same procedure was carried out in the same manner as in Example 6 to separate the polymer (yield: 30%).

The weight average molecular weight and polydispersity of the obtained polymer were 5,000 and 1.32, respectively.

EXAMPLE 10

Poly(2-methyl-2-norbornyl-5-norbornene-2-carboxylate-maleic Anhydride-3-hydroxytricyclo [6.2.1.0$^{2,7}$]-9-undecene)

Polymerization and separation were carried out in the same manner as in Example 9 to separate a polymer, except that 8.21 g of 2-methyl-2-norbornyl-5-norbornene-2-carboxylate, 4.9 g of maleic anhydride and 2.74 g of 3-hydroxytricyclo[6.2.1.0$^{2,7}$]-9-undecene were used (yield: 25%).

The weight average molecular weight and polydispersity of the obtained polymer were 5,700 and 1.72, respectively.

EXAMPLE 11

Poly(8-ethyl-8-tricyclo[5.2.1.0$^{2,6}$]decanyl-5-norbornene-2-carboxylate-maleic Anhydride-2,4 Dihydroxy-3,3-dimethylbutyric Acid Lactonyl-5-norbornene-2-carboxylate)

6 g of 8-ethyl-8-tricyclo[5.2.1.0$^{2,6}$]decanyl-5-norbornene-2-carboxylate prepared in Example 3, 2.45 g of maleic anhydride, 1.26 g of 2,4 dihydroxy-3,3-dimethylbutyric acid lactonyl-5-norbornene-2-carboxylate prepared in Example 5 were dissolved in 2.45 g of anhydrous ethylacetate. 0.410 g of AIBN was added to the resultant product, degassed and polymerized at a temperature of about 65° C. for about 24 hours. The reactant product was precipitated in 500 ml of isopropyl alcohol and then filtered. Then, the precipitate was dissolved in THF and then reprecipitated in 500 ml of isopropyl alcohol two times more. The precipitate was filtered using a glass filter and then dried in a vacuum oven of 50° C. for about 24 hours to separate a polymer (yield: 65%).

The weight average molecular weight and polydispersity of the obtained polymer were 11,000 and 1.93, respectively.

EXAMPLE 12

Poly(2-methyl-2-adamantyl-5-norbornene-2-carboxylate-maleic Anhydride-2,4 Dihydroxy-3,3-dimethylbutyric Lactonyl-5-norbornene-2-carboxylate)

Polymerization was carried out in the same manner as in Example 11, except that 2.45 g of 2-methyl-2-adamantyl-5-norbornene-2-carboxylate was used instead of 8-ethyl-8-tricyclo[5.2.1.0$^{2,6}$]decanyl-5-norbornene-2-carboxylate to separate a polymer (yield: 70%).

The weight average molecular weight and polydispersity of the obtained polymer were 15,000 and 2.18, respectively.

EXAMPLE 13

Poly(2-ethyl-2-adamantyl-5-norbornene-2-carboxylate-maleic Anhydride-2,4 Dihydroxy-3,3-dimethylbutyric Acid Lactonyl-5-norbornene-2-carboxylate)

Polymerization was carried out in the same manner as in Example 11, except that 2-ethyl-2-adamantyl-5-norbornene-2-carboxylate was used instead of 8-ethyl-8-tricyclo[5.2.1.0$^{2,6}$]decanyl-5-norbornene-2-carboxylate to separate a polymer (yield: 8%).

The weight average molecular weight and polydispersity of the obtained polymer were 15,000 and 2.1, respectively.

EXAMPLE 14

Poly(8-ethyl-8-tricyclo[5.2.1.0$^{2,6}$]decanyl-5-norbornene-2-carboxylate-maleic Anhydride-2(3),4 Dihydroxybutyric Acid Lactonyl-5-norbornene-2-carboxylate)

Polymerization was carried out in the same manner as in Example 11, except that 1.21 g of 2(3),4 dihydroxybutyric acid-lactonyl-5-norbornene-2-carboxylate prepared in Example 5 was used instead of 2,4 dihydroxy-3,3-dimethylbutyric acid lactonyl-5-norbornene-2-carboxylate to separate a polymer.

The weight average molecular weight and polydispersity of the obtained polymer were 11,300 and 1.97, respectively.

EXAMPLE 15

Poly(2-ethyl-2-adamantyl-5-norbornene-2-carboxylate-maleic Anhydride-2(3),4 Dihydroxyburyric Acid Lactonyl-5-norbornene-2-carboxylate)

Polymerization was carried out in the same manner as in Example 14, except that 2-ethyl-2-adamantyl-5-norbornene-2-carboxylate was used instead of 8-ethyl-8-tricyclo[5.2.1.0$^{2,6}$]decanyl-5-norbornene-2-carboxylate to separate a polymer (yield: 68%).

The weight average molecular weight and polydispersity of the obtained polymer were 13,000 and 1.96, respectively.

EXAMPLE 16

Poly((1-adamantyl-1-methylethyl)-5-norbornene-2-carboxylate-maleic Anhydride-cis-5-norbornene-endo-2,3-dicarboxylic Anhydride)

5.3 g of (1-adamantyl-1-methylethyl)-5-norbornene-2-carboxylate prepared in Example 1, 2.47 g of maleic anhydride and 1.38 g of cis-5-norbornene-endo-2,3-dicarboxylic anhydride were dissolved in 4.6 g of ethyl acetate. 0.084 g of AIBN was added to the reactant product and then polymerization was carried out in the same manner as in Example 6 to separate a polymer (yield: 30%).

The weight average molecular weight and polydispersity of the obtained polymer were 13,000 and 1.64, respectively.

EXAMPLE 17

Poly(2-methyl-2-norbornyl-5-norbornene-2-carboxylate-maleic Anhydride-cis-5-norbornene-endo-2,3-dicarboxylic Anhydride)

8.21 g of (2-methyl-2-norbornyl-5-norbornene-2-carboxylate prepared in Example 2, 4.90 g of maleic anhydride and 2.74 g of cis-5-norbornene-endo-2,3-dicarboxylic anhydride were dissolved in 4.6 g of ethyl acetate. 0.084 g of AIBN was added to the reactant product and then polymerization was carried out in the same manner as in Example 6 to separate a polymer (yield: 30%).

The weight average molecular weight and polydispersity of the obtained polymer were 12,000 and 1.72, respectively.

EXAMPLE 18

Poly(8-ethyl-8-tricyclo[5.2.1.0$^{2,6}$]decanyl-5-norbornene-2-carboxylate-maleic Anhydride-3-hydroxytricyclo[6.2.1.0$^{2,7}$]-9-undecene-5-norbornene-2-carboxylate)

80 mmol of 8-ethyl-8-tricyclo[5.2.1.0$^{2,6}$]decanyl-5-norbornene-2-carboxylate prepared in Example 3, 100 mmol of maleic anhydride, 15 mmol of 3-hydroxytricyclo[6.2.1.0$^{2,7}$]-9-undecene and 5 mmol of 5-norbornene-2-carboxylic acid were dissolved in 0.5 equivalent of anhydrous ethyl acetate. AIBN (1 mol %) was added to the reactant product and purged using a nitrogen gas for about 2 hours to then be polymerized at a temperature of about 65° C. for about 24 hours.

6.7 g of a polymer was separated in the same manner as in Example 7.

The weight average molecular weight and polydispersity of the obtained polymer were 11,500 and 1.7, respectively.

EXAMPLE 19

Poly(8-ethyl-8-tricyclo[5.2.1.0$^{2,6}$]decanyl-5-
norbornene-2-carboxylate-maleic Anhydride-3-
hydroxytricyclo[6.2.1.0$^{2,7}$]-9-undecene-2-
hydroxyethyl-5-norbornene-2-carboxylic Acid)

Polymerization and separation were carried out in the same manner as in Example 18 using 80 mmol of 8-ethyl-8-tricyclo[5.2.1.0$^{2,6}$]decanyl-5-norbornene-2-carboxylate prepared in Example 3,100 mmol of maleic anhydride, 10 mmol of 3-hydroxytricyclo[6.2.1.0$^{2,7}$]-9-undecene and 10 mmol of 2-hydroxyethyl-5-norbornene-2-carboxylate, to separate 7.24 g of a polymer.

The weight average molecular weight and polydispersity of the obtained polymer were 12,300 and 1.65, respectively.

EXAMPLE 20

Poly(8-ethyl-8-tricyclo[5.2.1.0$^{2,6}$]decanyl-5-
norbornene-2-carboxylate-maleic Anhydride-3-
hydroxytricyclo[6.2.1.0$^{2,7}$]-9-undecene-acrylic Acid)

80 mmol of 8-ethyl-8-tricyclo[5.2.1.0$^{2,6}$]decanyl-5-norbornene-2-carboxylate prepared in Example 3, 100 mmol of maleic anhydride, 15 mmol of 3-hydroxytricyclo[6.2.1.0$^{2,7}$]-9-undecene and 5 mmol of acrylic acid were dissolved in 0.5 equivalent of anhydrous ethyl acetate. Then, polymerization and separation were carried out in the same manner as in Example 18 to separate 4.56 g of a polymer.

The weight average molecular weight and polydispersity of the obtained polymer were 12,500 and 1.7, respectively.

EXAMPLE 21

Poly(8-ethyl-8-tricyclo[5.2.1.0$^{2,6}$]decanyl-5-
norbornene-2-carboxylate-maleic Anhydride-3-
hydroxytricyclo[6.2.1.0$^{2,7}$]-9-undecene-2-
hydroxyethyl Acrylate)

Polymerization and separation were carried out in the same manner as in Example 18 using 75 mmol of 8-ethyl-8-tricyclo[5.2.1.0$^{2,6}$]decanyl-5-norbornene-2-carboxylate prepared in Example 3, 100 mmol of maleic anhydride, 15 mmol of 3-hydroxytricyclo[6.2.1.0$^{2,7}$]-9-undecene and 10 mmol of 2-hydroxyethylacrylate, to separate 5.74 g of a polymer.

The weight average molecular weight and polydispersity of the obtained polymer were 13,200 and 1.65, respectively.

EXAMPLE 22

Poly(8-ethyl-8-tricyclo[5.2.1.0$^{2,6}$]decanyl-5-
norbornene-2-carboxylate-maleic Anhydride-cis-5-
norbornene-endo-2,3-dicarboxylic Anhydride-5-
norbornene-2-carboxylic Acid)

Polymerization and separation were carried out in the same manner as in Example 18 using 80 mmol of 8-ethyl-8-tricyclo[5.2.1.0$^{2,6}$]decanyl-5-norbornene-2-carboxylate prepared in Example 3, 100 mmol of maleic anhydride, 15 mmol of cis-5-norbornene-endo-2,3-dicarboxylic anhydride and 5 mmol of 5-norbornene-2-carboxylic acid, to separate 6.7 g of a polymer.

The weight average molecular weight and polydispersity of the obtained polymer were 11,500 and 1.7, respectively.

EXAMPLE 23

Poly(8-ethyl-8-tricyclo[5.2.1.0$^{2,6}$]decanyl-5-
norbornene-2-carboxylate-maleic Anhydride-cis-5-
norbornene-endo-2,3-dicarboxylic Anhydride-2-
hydroxyethyl-5-norbornene-2-carboxylate)

Polymerization and separation were carried out in the same manner as in Example 18 using 80 mmol of 8-ethyl-8-tricyclo[5.2.1.0$^{2,6}$]decanyl-5-norbornene-2-carboxylate prepared in Example 3, 100 mmol of maleic anhydride,10 mmol of cis-5-norbornene-endo-2,3-dicarboxylic anhydride and 10 mmol of 2-hydroxylethyl-5-norbornene-2-carboxylate, to separate 7.24 g of a polymer.

The weight average molecular weight and polydispersity of the obtained polymer were 12,300 and 1.65, respectively.

EXAMPLE 24

Poly(8-ethyl-8-tricyclo[5.2.1.0$^{2,6}$]decanyl-5-
norbornene-2-carboxylate-maleic Anhydride-cis-5-
norbornene-endo-2,3-dicarboxylic Anhydride-
acrylic Acid)

80 mmol of 8-ethyl-8-tricyclo[5.2.1.0$^{2,6}$]decanyl-5-norbornene-2-carboxylate, 100 mmol of maleic anhydride, 15 mmol of cis-5-norbornene-endo-2,3-dicarboxylic anhydride and 5 mmol of acrylic acid were dissolved in 1 equivalent of anhydrous ethyl acetate, and then polymerization and separation were carried out in the same manner as in Example 18, to separate 4.56 g of a polymer.

The weight average molecular weight and polydispersity of the obtained polymer were 12,500 and 1.7, respectively.

EXAMPLE 25

Poly(8-ethyl-8-tricyclo[5.2.1.0$^{2,6}$]decanyl-5-
norbornene-2-carboxylate-maleic Anhydride-cis-5-
norbornene-endo-2,3-dicarboxylic Anhydride-2-
hydroxyethyl-5-norbornene-2-carboxylate)

Polymerization and separation were carried out in the same manner as in Example 18 using 75 mmol of 8-ethyl-8-tricyclo[5.2.1.0$^{2,6}$]decanyl-5-norbornene-2-carboxylate prepared in Example 3, 100 mmol of maleic anhydride, 15 mmol of cis-5-norbornene-endo-2,3-dicarboxylic anhydride and 10 mmol of 2-hydroxyethyl acrylate, to separate 5.74 g of a polymer.

The weight average molecular weight and polydispersity of the obtained polymer were 13,200 and 1.65, respectively.

Method of Preparing Photoresist Composition and
Photolithography Process Using the Same

EXAMPLE 26

1.0 g of a copolymer prepared in Example 5 by polymerizing 1-adamantyl-1-methylethyl-5-norbornene-2-carboxylate and maleic anhydride in a ratio of 1:1, 0.02 g of triphenylsulfonium triflate as a photoacid generator and 2 mg of triisobutylamine as an organic base were dissolved in 6.0 g of propylene glycol monomethyl ether acetate (PGMEA). Subsequently, the mixture was filtered using a 0.2 μm filter, resulting in a photoresist composition.

An anti-reflection layer was coated on a wafer where a patterning object material layer is formed and then the acquired photoresist composition was spin-coated to a thickness of about 0.3 μm. The photoresist composition coated wafer was pre-baked at a temperature of about 130° C. for about 90 seconds, exposed using a mask defining a predetermined pattern and an ArF excimer laser (NA: 0.6) as an exposure light source, and post-baked at a temperature of about 130° C. for about 90 seconds. Thereafter, the resultant was developed using 2.38% by weight of TMAH for about 60 seconds, thereby forming a photoresist pattern.

As a result, a 0.15 μm line and space photoresist pattern was obtained at an exposure dose of about 3.5 mJ/cm$^2$.

EXAMPLE 27

A photoresist composition was prepared in the same manner as in Example 26, except that 0.01 g of triphenylsulfonium triflate and 0.01 g of norbornene-dicarboxyimide triflate as photoacid generators were used, and then a photolithography process was performed in the same manner as in Example 26.

As a result, a 0.15 μm line and space photoresist pattern was obtained at an exposure dose of about 12 mJ/cm$^2$.

EXAMPLE 28

A photoresist composition was prepared in the same manner as in Example 26, using 1.0 g of a copolymer by polymerizing 8-ethyl-8-tricyclo[5.2.1.0$^{2,6}$]decanyl-5-norbornene-2-carboxylate and maleic anhydride in a ratio of 1:1, the copolymer prepared in Example 8, and then a photolithography process was performed in the same manner as in Example 26.

As a result, a 0.15 μm line and space photoresist pattern was obtained at an exposure dose of about 5 mJ/cm$^2$.

EXAMPLE 29

A photoresist composition was prepared in the same manner as in Example 26, using 1.0 g of poly(1-adamantyl-1-methylethyl-5-norbornene-2-carboxylate-maleic anhydride-3-hydroxytricyclo[6.2.1.0$^{2,7}$]-9-undecene), prepared in Example 9, and then a photolithography process was performed in the same manner as in Example 26.

As a result, a 0.16 μm line and space photoresist pattern was obtained at an exposure dose of about 3.5 mJ/cm$^2$.

EXAMPLE 30

A photoresist composition was prepared in the same manner as in Example 26, using 1.0 g of poly(8-ethyl-8-tricyclo[5.2.1.0$^{2,6}$]decanyl-5-norbornene-2-carboxylate-maleic anhydride-2,4 dihydroxy-3,3-dimethylbutyric acid lactonyl-5-norbornene-2-carboxylate), prepared in Example 11, 0.02 g of triphenylsulfonium triflate as a photoacid generator and 2 mg of triisobutyl amine as an organic base were dissolved in 8 g of PGMEA, and then a photolithography process was performed in the same manner as in Example 26.

As a result, a 0.13 μm line and space photoresist pattern was obtained at an exposure dose of about 17 mJ/cm$^2$.

EXAMPLE 31

A photoresist composition was prepared in the same manner as in Example 26, using 1.0 g of poly(2-methyl-2-adamantyl-5-norbornene-2-carboxylate-maleic anhydride-2,4 dihydroxy-3,3-dimethylbutyric acid lactonyl-5-norbornene-2-carboxylate), prepared in Example 12, 0.02 g of triphenylsulfonium triflate as a photoacid generator and 2 mg of triethanol amine as an organic base were dissolved in 8 g of PGMEA, and then a photolithography process was performed in the same manner as in Example 26.

As a result, a 0.13 μm line and space photoresist pattern was obtained at an exposure dose of about 18 mJ/cm$^2$.

EXAMPLE 32

A photoresist composition was prepared in the same manner as in Example 26, using 1.0 g of poly(2-ethyl-2-adamantyl-5-norbornene-2-carboxylate-maleic anhydride-2,4 dihydroxy-3,3-dimethylbutyric acid lactonyl-5-norbornene-2-carboxylate), prepared in Example 13, 0.02 g of triphenylsulfonium triflate as a photoacid generator and 2 mg of triisobutyl amine as an organic base were dissolved in 8 g of PGMEA, and then a photolithography process was performed in the same manner as in Example 26.

As a result, a 0.13 μm line and space photoresist pattern was obtained at an exposure dose of about 23 mJ/cm$^2$.

EXAMPLE 33

A photoresist composition was prepared in the same manner as in Example 26, using 1.0 g of poly(2-ethyl-2-adamantyl-5-norbornene-2-carboxylate-maleic anhydride-2(3),4 dihydroxybutyric acid lactonyl-5-norbornene-2-carboxylate), prepared in Example 15, 0.01 g of triphenylsulfonium triflate and 0.02 g of triisodecylamine as a photoacid generator, and 2 mg of triethanol amine as an organic base were dissolved in 8 g of PGMEA, and then a photolithography process was performed in the same manner as in Example 26.

As a result, a 0.13 μm line and space photoresist pattern was obtained at an exposure dose of about 31 mJ/cm$^2$.

EXAMPLE 34

A photoresist composition was prepared in the same manner as in Example 26, using 1.0 g of poly(1-adamantyl-1-methylethyl)-5-norbornene-2-carboxylate-maleic anhydride-cis-5-norbornene-endo-2,3-dicarboxylic anhydride), which was prepared in Example 16, 0.02 g of triphenylsulfonium triflate as a photoacid generator, and 1 mg of triisobutyl amine as an organic base were dissolved in 6 g of PGMEA and then a photolithography process was performed.

As a result, a 0.18 μm line and space photoresist pattern was obtained at an exposure dose of about 6 mJ/cm$^2$.

Measurement of Dry Etching Resistance

EXAMPLE 35

1.0 g of photosensitive polymers prepared in Examples 6 through 11 and 16 through 23 were dissolved in 6 g of PGMEA and then the resultant was coated on a silicon wafer. The photosensitive polymer coated wafer was pre-baked at a temperature of about 130° C. for about 90 seconds, and then the thicknesses of polymer layers were measured. Subsequently, a reactive ion etching (RIE) process was carried out using a Rainbow 4500, which is an IRE equipment available from Lam Co. The RIE process was performed with a power P$\mu$ of 700 W and under the pressure of 0.15 Torr, while supplying CF$_4$ and CHF$_3$ gases, each at a flow rate of 10 sccm. After the etching process was completed, the thicknesses of remaining polymer layers were measured to derive the etch rates thereof.

In order to attain comparable standards for etching resistance, the etch rate of SEPR 430S, which is a photosensitive polymer for deep UV (240 nm to 370 nm) manufactured by ShinEtsu Co., was measured in the same manner as described above. Also, the etch rates of poly (methyladamantylacrylate-cyclopentanoate acrylate) and poly(t-butyl norbornene carboxylate-maleic anhydride), which are conventional photosensitive polymers for use with an ArF excimer laser, as reference groups, were measured in the same manner as described above, and the results are listed in Table 2.

TABLE 2

| | Photosensitive polymer | Etch rate (Å/min) | Normalized etch rate based on the etch rate of SEPR 430S |
|---|---|---|---|
| Standard | SEPR 430S | 388 | 1 |
| Reference group | Poly(methyladamantylacrylate-cyclopentanoate acrylate) | 497 | 1.28 |
| | Poly(t-butyl norbornene carboxylate-maleic anhydride) | 537 | 1.38 |
| Example group | Poly(1-adamantyl-1-methylethyl-5-norbornene-2-carboxylate-maleic anhydride) | 422 | 1.09 |
| | Poly(2-methyl-2-norbornyl-5-norbornene-2-carboxylate-maleic anhydride) | 431 | 1.11 |
| | Poly(8-ethyl-8-tricyclo[5.2.1.0$^{2,6}$]-decanyl-5-norbornene-2-carboxylate-maleic anhydride) | 428 | 1.10 |
| | Poly(1-adamantyl-1-methylethyl-5-norbornene-2-carboxylate-maleic anhydride-3-hydroxytricyclo-[6.2.1.0$^{2,7}$]-9-undecene) | 424 | 1.09 |
| | Poly(2-methyl-2-norbornyl-5-norbornene-2-carboxylate-maleic anhydride-3-hydroxytricyclo-[6.2.1.0$^{2,7}$]-9-undecene) | 432 | 1.11 |
| | Poly(8-ethyl-8-tricyclo[5.2.1.0$^{2,6}$]-decanyl-5-norbornene-2-carboxylate-maleic anhydride-2,4-dihydroxy-3,3-dimethylbutyric acid lactonyl-5-norbornene-2-carboxylate) | 433 | 1.12 |
| | Poly(1-adamantyl-1-methylethyl-5-norbornene-2-carboxylate-maleic anhydride-cis-5-norbornene-endo-2,3-dicarboxylic anhydride) | 435 | 1.12 |
| | Poly(8-ethyl-8-tricyclo[5.2.1.0$^{2,6}$]-decanyl-5-norbornene-2-carboxylate-maleic anhydride-cis-5-norbornene-endo-2,3-dicarboxylic anhydride) | 432 | 1.11 |
| | Poly(2-methyl-2-norbornyl-5-norbornene-2-carboxylate-maleic anhydride-cis-5-norbornene-endo-2,3-dicarboxylic anhydride) | 437 | 1.13 |
| | Poly(8-ethyl-8-tricyclo[5.2.1.0$^{2,6}$]-decanyl-5-norbornene-2-carboxylate-maleic anhydride-3-hydroxytricyclo[6.2.1.0$^{2,7}$]-9-undecene-5-norbornene-2-carboxylic acid) | 421 | 1.08 |
| | Poly(8-ethyl-8-tricyclo[5.2.1.0$^{2,6}$]-decanyl-5-norbornene-2-carboxylate-maleic anhydride-3-hydroxytricyclo[6.2.1.0$^{2,7}$]-9-undecene-2-hydroxyethyl-5-norbornene-2-carboxylate) | 429 | 1.08 |
| | Poly(8-ethyl-8-tricyclo[5.2.1.0$^{2,6}$]-decanyl-5-norbornene-2-carboxylate-maleic anhydride-3-hydroxytricyclo[6.2.1.0$^{2,7}$]-9-undecene-2-acrylic acid) | 435 | 1.12 |
| | Poly(8-ethyl-8-tricyclo[5.2.1.0$^{2,6}$]-decanyl-5-norbornene-2-carboxylate-maleic anhydride-3-hydroxytricyclo[6.2.1.0$^{2,7}$]-9-undecene-2-hydroxyethyl-acrylate) | 437 | 1.13 |
| | Poly(8-ethyl-8-tricyclo[5.2.1.0$^{2,6}$]-decanyl-5-norbornene-2-carboxylate-maleic anhydride-cis-5-norbornene-endo-2,3-dicarboxylic anhydride-5-norbornene-2-carboxylic acid) | 458 | 1.18 |
| | Poly(8-ethyl-8-tricyclo[5.2.1.0$^{2,6}$]-decanyl-5-norbornene-2-carboxylate-maleic anhydride-cis-5-norbornene-endo-2,3-dicarboxylic anhydride-2-hydroxyethyl-5-norbornene-2-carboxylate) | 462 | 1.19 |

The etch rate of a polymer being closer to 1 implies that the etching resistance thereof is the same as that of the conventional photosensitive polymer for deep UV. While the etch rates of the conventional photosensitive polymers are 1.28 and 1.38, the etch rates of the photosensitive polymers according to the present invention were less than or equal to 1.13, which means that the photosensitive polymers according to the present invention have excellent etching resistance, compared to the conventional photosensitive polymers for use with an ArF excimer laser.

According to the present invention, since the backbone of a photosensitive polymer is cyclic and a $C_6$ to $C_{20}$ tertiary alicyclic hydrocarbon group is bonded to the backbone of the polymer, the etching resistance of the photoresist composition containing the same is large. Also, if a secondary cyclic alcohol group is bonded to the backbone of the polymer, the etching resistance is further increased and the contrast is excellent. Furthermore, adhesion to underlying layer materials is excellent. In the case where dissolution inhibitor group is bonded to the polymer, the photoresist layer in an unexposed region is not easily dissolved in a developing solution. If acid-labile bulky groups are bonded to the polymer,.there is a great difference in polarity of the photoresist composition between exposed regions and unexposed regions, and thus the contrast is further increased.

What is claimed is:
1. A photosensitive polymer comprising:
  a first monomer which is alicyclic hydrocarbon carboxylate having an acid-labile $C_8$ to $C_{20}$ tertiary alicyclic hydrocarbon group as a substituent; and
  a second monomer which is capable of free radical polymerization.
2. The photosensitive polymer according to claim 1, wherein the alicyclic hydrocarbon carboxylate is norbornene carboxylate.
3. The photosensitive polymer according to claim 1, wherein the second monomer is maleic anhydride.
4. The photosensitive polymer according to claim 1, wherein the $C_8$ to $C_{20}$ tertiary alicyclic hydrocarbon group is 2-methyl-2-norbornyl, 2-methyl-2-isobornyl, 8-ethyl-8-tricyclo[5.2.1.0$^{2,6}$]decanyl, 2-methyl-2-adamantyl, 2-ethyl-2-adamantyl or 1-adamantyl-1-methylethyl.
5. A photosensitive polymer comprising:
  a first monomer which is alicyclic hydrocarbon carboxylate having an acid-labile $C_8$ to $C_{20}$ tertiary alicyclic hydrocarbon group as a substituent;
  a second monomer which is capable of free radical polymerization; and a third monomer having secondary cyclic alcohol bonded to its backbone.

6. The photosensitive polymer according to claim 5, wherein the alicyclic hydrocarbon carboxylate is norbornene carboxylate and the second monomer is maleic anhydride.

7. The photosensitive polymer according to claim 5, wherein the $C_8$ to $C_{20}$ tertiary alicyclic hydrocarbon group is 2-methyl-2-norbornyl, 2-methyl-2-isobornyl, 8-ethyl-8-tricyclo[5.2.1.0$^{2.6}$]decanyl, 2-methyl-2-adamantyl, 2-ethyl-2-adamantyl or 1-adamantyl-1-methylethyl.

8. The photosensitive polymer according to claim 5, wherein the secondary cyclic alcohol is secondary polycyclic alcohol.

9. A photosensitive polymer comprising:
   a first monomer which is alicyclic hydrocarbon carboxylate having an acid-labile $C_8$ to $C_{20}$ tertiary alicyclic hydrocarbon group as a substituent;
   a second monomer which is capable of free radical polymerization; and
   at least one third monomer selected from the group consisting of (meth)acrylic acid, (meth)acrylate having $C_1$ to $C_{12}$ aliphatic alcohol as a substituent, (meth)acrylate having an acid-labile group as a substituent, and (meth)acrylate having a dissolution inhibitor group as a substituent.

10. The photosensitive polymer according to claim 9, wherein the alicyclic hydrocarbon carboxylate is norbornene carboxylate and the second monomer is maleic anhydride.

11. The photosensitive polymer according to claim 9, wherein the $C_8$ to $C_{20}$ tertiary alicyclic hydrocarbon group is 2-methyl-2-norbornyl, 2-methyl-2-isobornyl, 8-ethyl-8-tricyclo[5.2.1.0$^{2.6}$]decanyl, 2-methyl-2-adamantyl, 2-ethyl-2-adamantyl or 1-adamantyl-1-methylethyl.

12. The photosensitive polymer according to claim 9, wherein the $C_1$ to $C_{12}$ aliphatic alcohol pendent to (meth)acrylate is 2-hydroxyethyl; wherein the acid-labile group pendent to (meth)acrylate is t-butyl or $C_6$ to $C_{20}$ tertiary alicyclic hydrocarbon; and wherein the dissolution inhibitor group pendent to (meth)acrylate is methyl or $C_7$ to $C_{20}$ aliphatic hydrocarbon.

13. The photosensitive polymer according to claim 9, wherein the at least one third monomer is a monomer of (meth)acrylate having $C_1$ to $C_{12}$ aliphatic alcohol as a substituent or (meth)acrylate having a dissolution inhibitor group as a substituent.

14. A photosensitive polymer comprising:
   a first monomer which is alicyclic hydrocarbon carboxylate having an acid-labile $C_8$ to $C_{20}$ tertiary alicyclic hydrocarbon group as a substituent;
   a second monomer which is capable of free radical polymerization; and
   at least one third monomer selected from the group consisting of norbornene, norbornene-ol, norbornene having $C_1$ to $C_{12}$ aliphatic alcohol as a substituent, norbornene carboxylic acid, norbornene dicarboxylic anhydride, norbornene carboxylate having $C_1$ to $C_{12}$ aliphatic alcohol as a substituent, norbornene carboxylate having a lactone group as a substituent, norbornene carboxylate having an acid-labile group as a substituent, and norbornene carboxylate having a dissolution inhibitor group as a substituent.

15. The photosensitive polymer according to claim 14, wherein the alicyclic hydrocarbon carboxylate is norbornene carboxylate and the second monomer is maleic anhydride.

16. The photosensitive polymer according to claim 14, wherein the $C_8$ to $C_{20}$ tertiary alicyclic hydrocarbon group is 2-methyl-2-norbornyl, 2-methyl-2-isobornyl, 8-ethyl-8-tricyclo[5.2.1.0$^{2.6}$]decanyl, 2-methyl-2-adamantyl, 2-ethyl-2-adamantyl or 1-adamantyl-1-methylethyl.

17. The photosensitive polymer according to claim 14, wherein the $C_1$ to $C_{12}$ aliphatic alcohol pendent to norbornene is 2-hydroxymethyl; wherein the $C_1$ to $C_{12}$ aliphatic alcohol pendent to norbornene carboxylate is 2-hydroxyethyl; wherein the lactone group pendent to norbornene carboxylate is 2,4 dihydroxy-3,3-dimethyl butyric acid lactone or 2(3),4 dihydroxy butyric lactone; wherein the acid-labile group pendent to norbornene carboxylate is t-butyl, tetrahydropyranyl or 1-alkoxyethyl; and wherein the dissolution inhibitor group pendent to norbornene carboxylate is methyl.

18. The photosensitive polymer according to claim 14, wherein the at least one third monomer is a monomer of norbornene dicarboxylic anhydride or norbornene carboxylate having a lactone group as a substitutent.

19. The photosensitive polymer according to claim 18, wherein the lactone group is 2,4 dihydroxy-3,3-dimethylbutyric acid lactone or 2(3),4 dihydroxy butyric acid lactone.

20. A photosensitive polymer comprising:
   a first monomer which is alicyclic hydrocarbon carboxylate having an acid-labile $C_8$ to $C_{20}$ tertiary alicyclic hydrocarbon group as a substituent;
   a second monomer which is capable of free radical polymerization; and
   two or more monomers selected from the group consisting of a third monomer, a fourth monomer and a fifth monomer,
      wherein the third monomer is a monomer having a secondary cyclic alcohol group bonded to its backbone;
      wherein the fourth monomer is a monomer selected from the group consisting of (meth)acrylic acid, (meth)acrylate having $C_1$ to $C_{12}$ aliphatic alcohol as a substituent, (meth)acrylate having an acid-labile group as a substituent, and (meth)acrylate having a dissolution inhibitor group as a substituent; and
      wherein the fifth monomer is a monomer selected from the group consisting of norbornene, norbornene-ol, norbornene having $C_1$ to $C_{12}$ aliphatic alcohol as a substituent, norbornene carboxylic acid, norbornene dicarboxylic anhydride, norbornene carboxylate having $C_1$ to $C_{12}$ aliphatic alcohol as a substituent, norbornene carboxylate having a lactone group as a substituent, norbornene carboxylate having an acid-labile group as a substituent, and norbornene carboxylate having a dissolution inhibitor group as a substituent.

21. The photosensitive polymer according to claim 20, wherein the third monomer is secondary polycyclic alcohol; wherein the $C_1$ to $C_{12}$ aliphatic alcohol pendent to (meth)acrylate is 2-hydroxyethyl; wherein the acid-labile group pendent to (meth)acrylate is t-butyl or $C_6$ to $C_{20}$ tertiary alicyclic hydrocarbon; wherein the dissolution inhibitor group pendent to (meth)acrylate is methyl or $C_7$ to $C_{20}$ aliphatic hydrocarbon; wherein the $C_1$ to $C_{12}$ aliphatic alcohol pendent to norbornene is hydroxymethyl; wherein the $C_1$ to $C_{12}$ aliphatic alcohol pendent to norbornene carboxylate is 2-hydroxyethyl; wherein the lactone group pendent to norbornene carboxylate is 2,4 dihydroxy-3,3-dimethylbutyric acid lactone or 2(3),4 dihydroxy butyric acid lactone; wherein the acid-labile group pendent to norbornene carboxylate is t-butyl or tetrahydropyranyl or 1-alkoxyethyl; and wherein and the dissolution inhibitor group pendent to norbornene carboxylate is methyl.

* * * * *